United States Patent
Sakai

(10) Patent No.: US 7,969,107 B2
(45) Date of Patent: Jun. 28, 2011

(54) MOTOR CONTROL DEVICE

(75) Inventor: Atsuo Sakai, Okazaki (JP)

(73) Assignee: JTEKT Corporation, Osaka-shi (JP)

( * ) Notice: Subject to any disclaimer, the term of this patent is extended or adjusted under 35 U.S.C. 154(b) by 273 days.

(21) Appl. No.: 12/444,697

(22) PCT Filed: Oct. 5, 2007

(86) PCT No.: PCT/JP2007/069564
§ 371 (c)(1),
(2), (4) Date: Apr. 8, 2009

(87) PCT Pub. No.: WO2008/044634
PCT Pub. Date: Apr. 17, 2008

(65) Prior Publication Data
US 2010/0026227 A1 Feb. 4, 2010

(30) Foreign Application Priority Data

Oct. 12, 2006 (JP) .................... 2006-278885

(51) Int. Cl.
H02H 7/08 (2006.01)
H02H 7/09 (2006.01)

(52) U.S. Cl. ............ 318/400.21; 318/782; 318/563; 361/1; 361/23

(58) Field of Classification Search .......... 318/490, 318/474, 700, 400.01, 400.21, 563, 782; 361/1, 23, 31; 340/648
See application file for complete search history.

(56) References Cited

U.S. PATENT DOCUMENTS

| | | | | |
|---|---|---|---|---|
| 3,875,463 A | * | 4/1975 | Reuter et al. | 361/29 |
| 4,027,202 A | * | 5/1977 | Tyler et al. | 361/33 |
| 4,060,841 A | * | 11/1977 | Allen | 361/33 |
| 4,210,948 A | * | 7/1980 | Waltz | 361/76 |
| RE33,874 E | * | 4/1992 | Miller | 361/79 |
| 6,075,688 A | * | 6/2000 | Willard et al. | 361/92 |
| 6,906,492 B2 | * | 6/2005 | Matsushita | 318/727 |
| 7,215,518 B2 | * | 5/2007 | Matsumoto et al. | 361/23 |
| 7,301,737 B2 | * | 11/2007 | Shima | 361/31 |
| 7,782,000 B2 | * | 8/2010 | Suzuki | 318/434 |
| 7,813,626 B2 | * | 10/2010 | Suzuki | 388/812 |
| 2010/0201373 A1 | * | 8/2010 | Sato et al. | 324/537 |

FOREIGN PATENT DOCUMENTS

| | | | |
|---|---|---|---|
| JP | 10 75596 | | 3/1998 |
| JP | 2001 268986 | | 9/2001 |
| JP | 2004 64839 | | 2/2004 |
| JP | 2005 295688 | | 10/2005 |
| JP | 2007143244 A | * | 6/2007 |

* cited by examiner

Primary Examiner — Eduardo Colon-Santana
(74) Attorney, Agent, or Firm — Oblon, Spivak, McClelland, Maier & Neustadt, L.L.P.

(57) ABSTRACT

A microcomputer compares a low voltage LV and a middle voltage MV to a predetermined voltage Vth set at a value in the vicinity of the grounded voltage (0 V) on the basis of detected phase voltages Vu, Vv and Vw, and thus, detects a break in a power supply line.

4 Claims, 3 Drawing Sheets

| Broken portion | None | U | V | W | U&V | V&W | U&W |
|---|---|---|---|---|---|---|---|
| U-phase voltage (Vu) | 12 | 12 | 12 | 12 | 12 | 12 | 12 |
| V-phase voltage (Vv) | 9 | 0 | 0 | 12 | 0 | 0 | 0 |
| W-phase voltage (Vw) | 6 | 0 | 6 | 0 | 0 | 0 | 0 |
| High voltage (HV) | 12 | 12 | 12 | 12 | 12 | 12 | 12 |
| Middle voltage (MV) | 9 | 0 | 6 | 12 | 0 | 0 | 0 |
| Low voltage (LV) | 6 | 0 | 0 | 0 | 0 | 0 | 0 |

MOTOR CONTROL DEVICE

FIELD OF THE INVENTION

The present invention relates to a motor control device having a function of detecting a break in a power supply line.

BACKGROUND OF THE INVENTION

Conventionally, there have been motor control devices for controlling the operation of a motor (brushless motor) through the supply of a drive power of three phases (U, V, W). These motor control devices include, for example, a device for supplying drive power by switching the energized phase and the direction of the energization for every 60 degrees, that is, the energized pattern in terms of the electrical angle of the motor which is the object of the control as shown in FIG. 4 (see, for example, Patent Document 1).

In the case where there are two energized phases (drive phases) in the driving of the motor through such an energization with rectangular waves, the voltage on the drive phase power supply side becomes a high voltage HV, the voltage on the drive phase grounded side becomes a low voltage LV, and the voltage of the non-drive phase becomes a middle voltage MV. That is, the following relational expression is theoretically established between the respective phase voltages. The respective phase voltages are monitored to determine whether this relational expression is established, so that a break in a power supply line to the motor can be detected.

$$HV + LV - 2 \times MV = 0 \qquad (1)$$

Patent Document 1: Japanese Laid-Open Patent Publication No. 2005-295688

SUMMARY OF THE INVENTION

In reality, however, there is a great change in the respective phase voltages when the energized phase is switched. Therefore, in some cases, the relationship of the above-described expression (1) is not established between the detected voltage values due to noise caused by the change in the voltage. According to the prior art, it is necessary to set the time for monitoring the voltage values comparatively long in order to avoid errors in detection caused by the noise as described above (for example, in the case where a predetermined counter value is incremented whenever it is detected that the above-described relationship is not established and when the total value exceeds a predetermined threshold value, it is determined that one of the power supply lines has been broken. In this configuration, the threshold value is set high). This hinders a quick detection of a break. Furthermore, when there is a two-phase break, and thus energization of the motor becomes impossible, a quicker response is required. According to the conventional method, however, a one-phase break and a two-phase break cannot be distinguished from one another. For this reason, a two-phase break in a line, which should be treated more urgently, cannot be detected quickly.

An objective of the present invention is to provide a motor control device in which a break in a power supply line can be quickly detected with a simple configuration.

In order to solve the above-described problem, a first aspect of the present invention provides a motor control device having control means for outputting a motor control signal and a drive circuit formed by connecting pairs of switching elements connected in series in parallel so that each switching element is turned on or off on the basis of the motor control signal, to thereby convert a direct current power into a drive power of three phases, which is then supplied to a motor, wherein the control means generates the motor control signal in order to supply the drive power through an energization with rectangular waves for switching the energized phase and the direction of the energization for every predetermined electrical angle of the motor, and at the same time, carries out a PWM control on each switching element on the grounded side to thereby control the voltage applied to the motor, characterized by including voltage detection means for detecting each phase voltage of the motor and break detection means for detecting a break in a power supply line corresponding to each phase on the basis of the each detected phase voltage, wherein the break detection means determines that at least one of the power supply lines is broken in the case where the low voltage of the respective detected phase voltages is lower than a predetermined voltage set in the vicinity of the grounded voltage, and determines that two of the power supply lines are broken in the case where the middle voltage of the respective phase voltages is lower than the predetermined voltage.

With the above-described configuration, a one-phase break in a line and a two-phase break in a line can be distinguished and detected. As a result, when there is a two-phase break in a line which requires a quick response, this break can be detected more quickly.

In the above-described configuration, it is preferable for the break detection means to set the predetermined voltage on the basis of a target value of the low voltage defined by the power supply voltage and the duty cycle of the PWM control. That is, without any break, the low voltage does not become lower than or equal to a target value when the energized phase is switched. Accordingly, with the above-described configuration, an error in detection due to noise which accompanies the switching of the energized phase can be avoided, and therefore, it becomes possible to detect a break with high precision. As a result, the time for monitoring can be shortened, and a break can be detected more quickly.

In the above-described configuration, it is preferable for the break detection means to have a counter for adding a predetermined value per every detection of break and determine the detection of break on the basis of the comparison between the low voltage and middle voltage and the predetermined voltage for every predetermined period, and at the same time, determine the detection of a break in the power supply line in the case where a cumulative value of the counter becomes a predetermined threshold value or higher, and for the value in the case where two breaks are detected to be set to be greater than the value in the case where at least one break in the power supply lines is detected as the predetermined addition value. In this case, when there is a two-phase break in a line, which should be treated more urgently, the detection of a break can be determined more quickly.

BRIEF DESCRIPTION OF THE DRAWINGS

FIG. 1 is a schematic diagram showing the configuration of a motor control device;

DETAILED DESCRIPTION OF THE PREFERRED EMBODIMENTS

Figure 2:
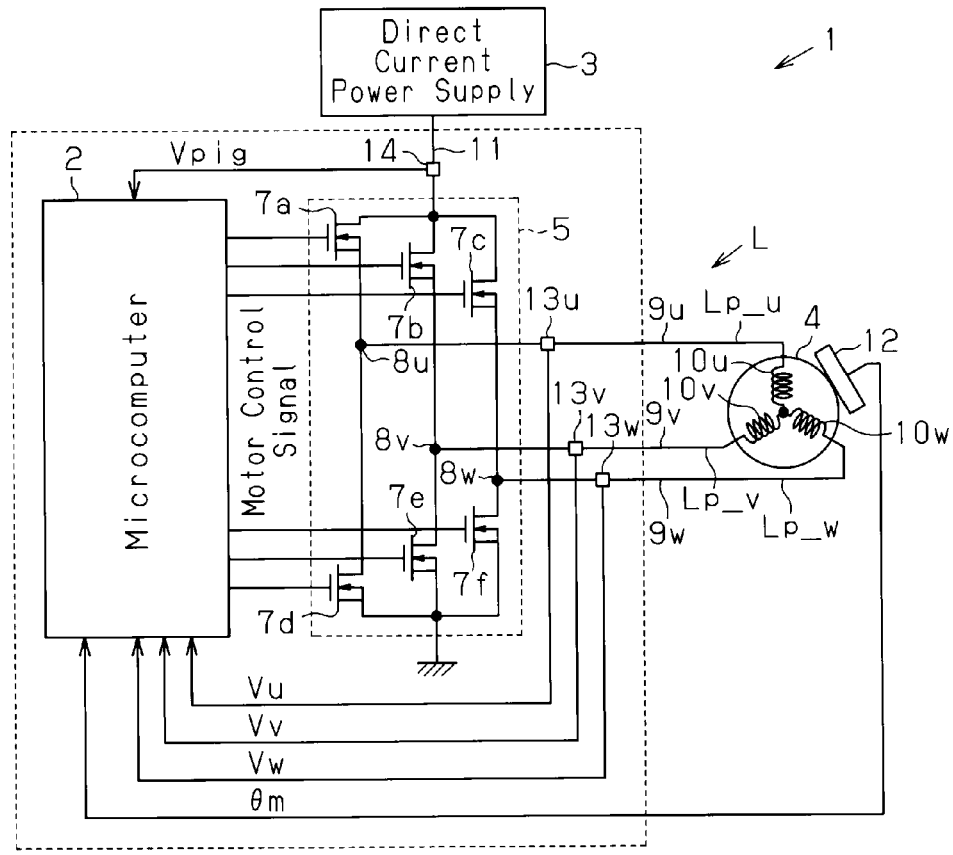
FIG. 2 is a diagram illustrating changes in voltage when a line is broken.

In the following, one embodiment of the present invention will be described with reference to the drawings.

As shown in FIG. 1, a motor control device 1 is provided with a microcomputer 2, which is control means for outputting a motor control signal, and a drive circuit 5 for supplying a drive power of three phases (U, V, W) to a motor 4 on the basis of a motor control signal output from the microcomputer 2. The drive circuit 5 is provided between a direct current power supply 3 and the motor (brushless motor) 4 in a power supply path L.

The drive circuit 5 is a known PWM inverter in which pairs of serially connected switching elements (FETs) are connected. Specifically, series circuits (arms) of pairs of FETs 7a and 7d, FETs 7b and 7e, and FETs 7c and 7f are connected in parallel in the drive circuit 5. The FETs 7a, 7b and 7c on the upper side of each arm are connected to the positive terminal of the direct current power supply 3 via a power supply line 11, and the FETs 7d, 7e and 7f on the lower side are grounded. The respective nodes 8u, 8v and 8w between the FETs 7a and 7d, between the FETs 7b and 7e and between the FETs 7c and 7f are connected to motor coils 10u, 10v and 10w of the motor 4 via power lines 9u, 9v and 9w, respectively. That is, the power supply lines Lp_u, Lp_v and Lp_w corresponding to the respective phases of the motor 4 are formed of the power lines 9u, 9v and 9w and the motor coils 10u, 10v and 10w, respectively. In addition, the gate terminals of the respective FETs 7a to 7f are connected to the microcomputer 2. The motor control signal output from the microcomputer 2 is input into the gate terminals of the respective FETs 7a to 7f. In response to this motor control signal, the respective FETs 7a to 7f are turned on or off, and thus, the direct current power from the direct current power supply 3 is converted to a drive power of three phases, which is then supplied to the motor 4.

Figure 4:
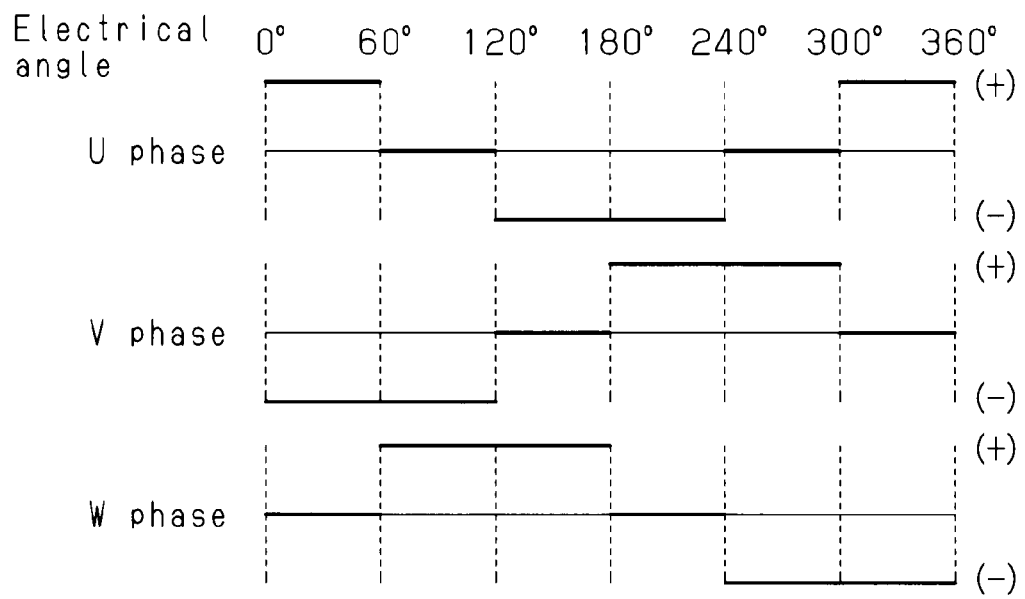
FIG. 4 is a diagram showing an energization with rectangular waves.

Meanwhile, a rotational angle sensor 12 for detecting the rotational angle (electrical angle) θm of the motor 4 is connected to the microcomputer 2. The microcomputer 2 generates a motor control signal on the basis of the rotational angle θm detected by the rotational angle sensor 12. Specifically, the microcomputer 2 generates a motor control signal in order to supply a drive power through an energization with rectangular waves for switching the energized phase and the direction of the energization for every electrical angle (60°) of the motor 4, namely, the energized pattern (see FIG. 4). The microcomputer 2 carries out PWM control on each FET 7d, 7e and 7f on the grounded side. That is, the microcomputer 2 outputs a pulse signal to each FET 7d, 7e and 7f as a motor control signal and controls the voltage applied to the motor by changing the duty cycle of this pulse signal.

(Detection of Break in Power Supply Line)

Next, a description will be given of the detection of a break in a power supply line in the motor control device.

The microcomputer 2 is break detection means for detecting a break in a power supply line Lp_u, Lp_v and Lp_w corresponding to each phase of the motor 4.

Voltage sensors 13u, 13v and 13w as voltage detection means are provided to the respective power lines 9u, 9v and 9w for connecting the motor 4 and the drive circuit 5. The respective phase voltages Vu, Vv and Vw of the motor 4 detected by the respective voltage sensors are input into the microcomputer 2. The microcomputer 2 compares the low voltage LV and the middle voltage MV to a predetermined voltage Vth set at a value in the vicinity of the grounded voltage (0 V) on the basis of the respective detected phase voltages Vu, Vv and Vw to thereby detect a break in each power supply line Lp_u, Lp_v and Lp_w.

As shown in FIG. 2, for example, in the case where the power supply voltage Vpig is 12 V when a current flows from the U phase to the W phase and the PWM duty cycle thereof is 50%, the U-phase voltage Vu, which becomes the high voltage HV, is 12 V, the W-phase voltage Vw, which becomes the low voltage LV, is 6 V, and the V-phase voltage Vv, which becomes the middle voltage MV, is 9 V if there is no break in any of the power supply lines Lp_u, Lp_v and Lp_w. If there is a break in any of the power supply lines Lp_u, Lp_v and Lp_w, however, the low voltage LV and the middle voltage MV change.

Specifically, in the case where the power supply line Lp_u corresponding to the U-phase is broken, the V-phase voltage Vv and the W-phase voltage Vw theoretically become 0 V. In the case where the power supply line Lp_v corresponding to the V phase is broken, the V-phase voltage Vv theoretically becomes 0 V. In the case where the power supply line Lp_w corresponding to the W phase is broken, the W-phase voltage Vw theoretically becomes 0 V. In the case where two of the power supply lines Lp_u, Lp_v and Lp_w are broken, the V-phase voltage Vv and the W-phase voltage Vw theoretically become 0 V.

That is, if the low voltage LV becomes 0 V when the motor is running, it is determined that at least one of the power supply lines Lp_u, Lp_v and Lp_w is broken. Furthermore, if the middle voltage MV becomes 0 V, it is highly likely that two of the power supply lines Lp_u, Lp_v and Lp_w becoming broken. In the present embodiment, the microcomputer 2 monitors the low voltage LV and the middle voltage MV in this manner, and detects a break in the power supply lines Lp_u, Lp_v and Lp_w.

In more detail, a voltage sensor 14 is provided to the power supply line 11 for connecting the direct current power supply 3 to the drive circuit 5. The power supply voltage Vpig detected by the voltage sensor 14 is input into the microcomputer 2. The microcomputer 2 sets the above-described predetermined voltage Vth used for determining the detection of a break on the basis of the target value (target voltage TV) for the low voltage LV as prescribed by the detected power supply voltage Vpig and the duty cycle (PWM duty) in the PWM control.

Specifically, the microcomputer 2 calculates the target voltage on the basis of the expression (2) shown below, and sets the predetermined voltage Vth on the basis of the expression (3). "α" in the expression (3) is a predetermined coefficient. In the case where the low voltage LV is lower than the predetermined voltage Vth, the microcomputer 2 determines that at least one of the power supply lines Lp_u, Lp_v and Lp_w is broken. In addition, in the case where the middle voltage MV is lower than the predetermined voltage Vth, the microcomputer 2 determines that two of the power supply lines Lp_u, Lp_v and Lp_w are broken.

$$TV = V\text{pig} \times (1 - PWM\text{duty}) \quad (2)$$

$$Vth = TV - \alpha \times V\text{pig} \quad (3)$$

The microcomputer 2 has a counter (not shown) for adding a predetermined value every time a break is detected. The microcomputer 2 determines whether there is a break, as described above, every predetermined period (for example every 6 ms). In the case where a cumulative value (C) becomes a predetermined threshold value or higher (C0, for example "200"), the microcomputer 2 determines the detection of a break in the power supply lines Lp_u, Lp_v and Lp_w. In the present embodiment, as predetermined addition values, the value in the case where two breaks from among the power supply lines Lp_u, Lp_v and Lp_w are detected (second addition value n2, for example "70") is set greater than the value in the case where at least one break is detected (first addition value n1, for example "10").

Figure 3:
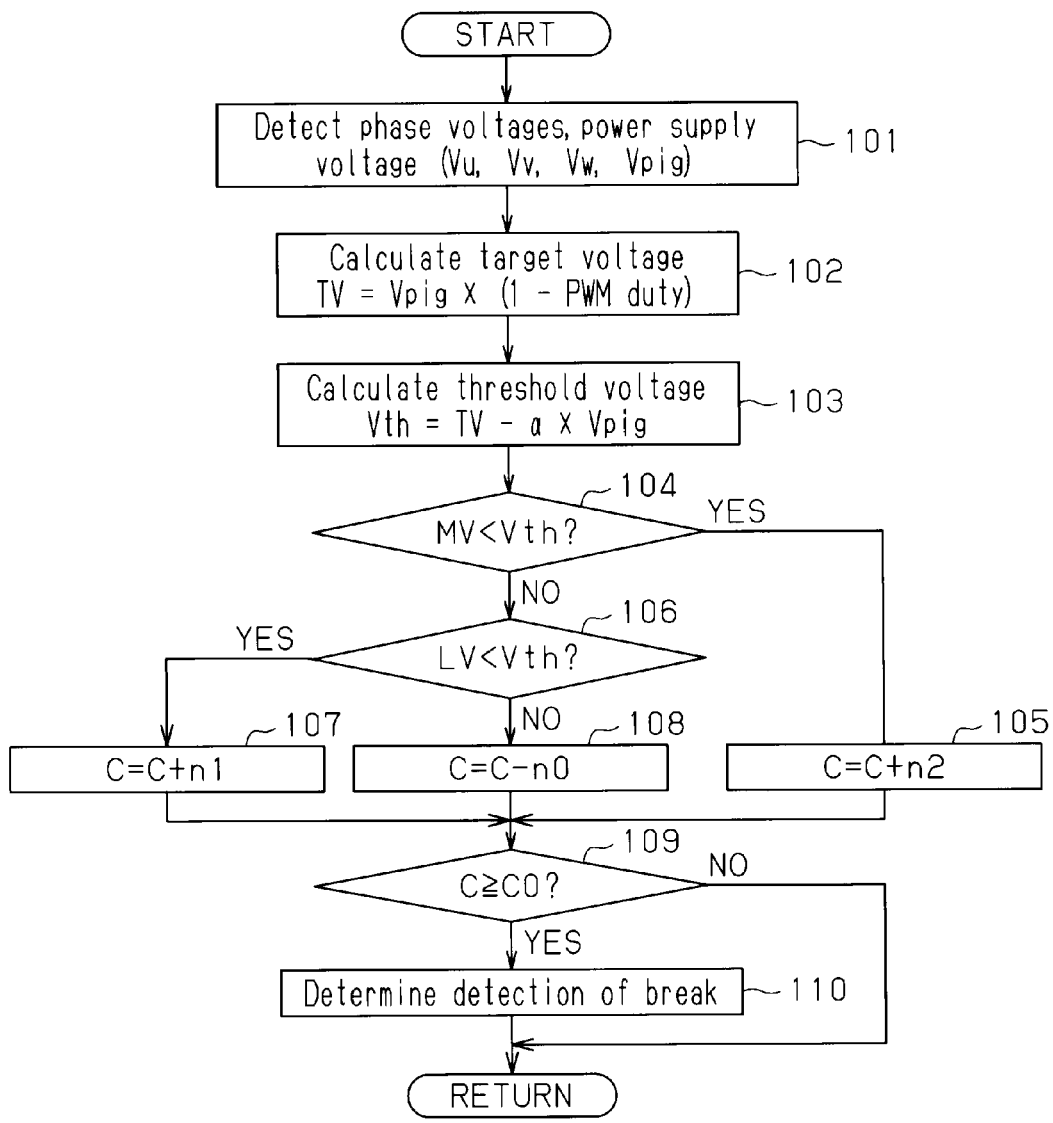
FIG. 3 is a flowchart showing the procedure of a process for detecting a break.

As shown in the flowchart in FIG. 3, when detecting the respective phase voltages Vu, Vv and Vw and the power supply voltage Vpig (Step 101), the microcomputer 2 first calculates the target voltage TV (see above expression (2), Step 102), and subsequently calculates the predetermined voltage Vth (see above expression (3), Step 103).

Next, the microcomputer 2 determines whether the middle voltage MV is smaller than the predetermined voltage Vth (Step 104). In the case where the middle voltage MV is smaller than the predetermined voltage Vth (MV<Vth: YES in Step 104), the microcomputer 2 adds the second addition value n2 in the counter (C=C+n2: Step 105).

Meanwhile, in the case where the middle voltage MV is the predetermined voltage Vth or higher (NO in Step 104), the microcomputer 2 determines whether the low voltage LV is smaller than the predetermined voltage Vth (Step 106). In the case where the low voltage LV is smaller than the predetermined voltage Vth (LV<Vth: YES in Step 106), the microcomputer 2 adds the first addition value n1 to the cumulative value C in the counter (C=C+n1: Step 107).

In the case where the low voltage LV is the predetermined voltage Vth or higher (NO in Step 106), the microcomputer 2 subtracts a predetermined value n0 (for example "1") from the cumulative value C in the counter (Step 108).

After carrying out one of Step 105, Step 107 and Step 108, the microcomputer 2 determines whether the cumulative value C in the counter is a predetermined threshold value C0 or higher (Step 109). In the case where the cumulative value C is the threshold value C0 or higher (C≧C0: YES in Step 109), the microcomputer 2 determines the detection of a break in the power supply lines Lp_u, Lp_v and Lp_w (Step 110).

In the case where the cumulative value C is smaller than the threshold value C0 (NO in Step 109), the microcomputer 2 does not carry out Step 110. The microcomputer 2 carries out Step 101 to Step 110 every predetermined period and determines whether there is a break in the respective power supply lines Lp_u, Lp_v and Lp_w.

In the above-described present embodiment, the following advantages are obtained.

(1) The microcomputer 2 compares the low voltage LV and the middle voltage MV to the predetermined voltage Vth set in the vicinity of the ground voltage (0 V) on the basis of the detected phase voltages Vu, Vv and Vw, and thus, detects a break in the power supply lines Lp_u, Lp_v and Lp_w. That is, in the case where the low voltage LV becomes 0 V with the motor running, it is determined that at least one of the power supply lines Lp_u, Lp_v and Lp_w is broken. In addition, in the case where the middle voltage MV becomes 0 V, the possibility of two of the power supply lines Lp_u, Lp_v and Lp_w being broken becomes high. That is, in the above-described configuration, a one-phase break and a two-phase break can be distinguished from each other when detected. As a result, when there is a two-phase break requiring quick response, a break in the power supply line can be detected more quickly.

(2) The microcomputer 2 sets the predetermined voltage Vth used for determining the detection of a break on the basis of the target value (target voltage TV) of the low voltage LV, which is defined by the power supply voltage Vpig and the duty cycle (PWM duty) in the PWM control. That is, in a state where there is no break, the low voltage LV does not become the target voltage TV or lower even when the energized phase is switched. Accordingly, with the above-described configuration, erroneous detection due to noise caused by switching of the energized phase can be avoided, and therefore, a break is detected with high precision. As a result, the time for monitoring can be shortened, and thus, a break can be detected more quickly.

(3) The microcomputer 2 has a counter for adding a predetermined value whenever a break is detected. In addition, the microcomputer 2 carries out a determination process in order to detect a break for every predetermined period (for example, every 6 ms). The microcomputer 2 also determines the detection of a break in the power supply lines Lp_u, Lp_v and Lp_w when the cumulative value (C) becomes a predetermined threshold value or higher (C0, for example "200"). As predetermined addition values, the value in the case where two breaks from among the power supply lines Lp_u, Lp_v and Lp_w are detected (second addition value n2, for example "70") is set greater than the value in the case where at least one break is detected (first addition value n1, for example "10"). With this configuration, when there is a two-phase break, which should be treated more urgently, the detection of a break can be determined more quickly.

The present embodiment may be modified as follows.

In the present embodiment, the predetermined voltage Vth used for determining the detection of a break is set on the basis of the target value for the low voltage LV (target voltage TV), which is defined by the power supply voltage Vpig and the duty cycle (PWM duty) in the above-described PWM control (see above expressions (2) and (3)). However, the invention is not limited to this, and the threshold value may be set in advance in the vicinity of the ground voltage (0 V), and the detection of a break may be determined through comparison with the set threshold value.

In the present embodiment, determination for detecting a two-phase break through comparison of the middle voltage MV and the predetermined voltage Vth (Step 104) and determination for detecting a one-phase break through comparison of the low voltage LV and the predetermined voltage Vth (Step 106) are carried out in the same routine to determine the detection of a break. However, the invention is not limited to this, and the determination of the detection of a one-phase break and the determination of the detection of a two-phase break may be carried out separately, and these detections may be determined separately.

Although in the present embodiment the microcomputer 2 forms control means and break detecting means, the control means and a break detecting means may be formed separately.

The invention claimed is:

1. A motor control device comprising control means for outputting a motor control signal and a drive circuit formed by connecting pairs of serially connected switching elements in parallel so that each switching element is turned on or off on the basis of the motor control signal, to thereby convert a direct current power into a drive power of three phases, which is then supplied to a motor, wherein the control means generates the motor control signal in order to supply the drive power through an energization with rectangular waves for switching an energized phase and a direction of the energization for every predetermined electrical angle of the motor, and carries out a PWM control on each switching element on the grounded side to thereby control a voltage applied to the motor, the motor control device by comprising:

voltage detection means for detecting each phase voltage of the motor; and break detection means for detecting a break in a power supply line corresponding to each phase on the basis of each detected phase voltage, wherein the break detection means determines that at least one of the power supply lines is broken in the case where a low voltage of the detected phase voltages is lower than a predetermined voltage set in the vicinity of the grounded voltage, and determines that two of the power supply lines are broken in the case where a middle voltage of the phase voltages is lower than the predetermined voltage.

2. The motor control device according to claim 1, wherein the break detection means sets the predetermined voltage on the basis of a target value of the low voltage defined by the power supply voltage and a duty cycle of the PWM control.

3. The motor control device according to claim 2, wherein the break detection means has a counter for adding a predetermined value at every detection of a break and determines a break on the basis of a comparison of the low voltage and middle voltage to the predetermined voltage for every predetermined period, wherein, when an accumulated value of the counter becomes a predetermined threshold value or higher, the break detection means determines a break in the power supply line, and
wherein, as the predetermined value to be added, the value in the case where two breaks of the power supply lines are detected is set to be greater than the value in the case where at least one break is detected.

4. The motor control device according to claim 1, wherein the break detection means has a counter for adding a predetermined value at every detection of a break and determines a break on the basis of a comparison of the low voltage and middle voltage to the predetermined voltage for every predetermined period, wherein, when an accumulated value of the counter becomes a predetermined threshold value or higher, the break detection means determines a break in the power supply line, and
wherein, as the predetermined value to be added, the value in the case where two breaks of the power supply lines are detected is set to be greater than the value in the case where at least one break is detected.

* * * * *